United States Patent
Costello et al.

(10) Patent No.: US 6,583,638 B2
(45) Date of Patent: *Jun. 24, 2003

(54) TEMPERATURE-CONTROLLED SEMICONDUCTOR WAFER CHUCK SYSTEM

(75) Inventors: Simon Costello, Los Angeles, CA (US); Tuyen Paul Pham, Sunland, CA (US)

(73) Assignee: Trio-Tech International, San Fernando, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 52 days.

(21) Appl. No.: 09/238,009

(22) Filed: Jan. 26, 1999

(65) Prior Publication Data

US 2002/0017916 A1 Feb. 14, 2002

(51) Int. Cl.$^7$ .................................. G01R 1/02
(52) U.S. Cl. ...................... 324/760; 324/158.1
(58) Field of Search .................. 324/760, 761, 324/762, 158.1, 765, 763; 165/80.1, 80.2, 80.4

(56) References Cited

U.S. PATENT DOCUMENTS

| | | | |
|---|---|---|---|
| 5,001,423 A | | 3/1991 | Abrami et al. ............... 324/158 |
| 5,084,671 A | * | 1/1992 | Miyata et al. ............ 324/158.1 |
| 5,435,379 A | * | 7/1995 | Moslehi et al. ............. 165/80.4 |
| 5,610,529 A | | 3/1997 | Schwindt ..................... 324/760 |
| 5,663,653 A | | 9/1997 | Schwindt et al. ........... 324/754 |
| 6,032,724 A | * | 3/2000 | Hatta ......................... 165/80.2 |
| 6,037,793 A | * | 3/2000 | Miyazawa et al. .......... 324/760 |

FOREIGN PATENT DOCUMENTS

| | | | |
|---|---|---|---|
| EP | 0 255 247 A2 | 2/1988 | ........... G01R/31/28 |
| EP | 0 743 530 A2 | 11/1996 | ........... G01R/31/28 |

OTHER PUBLICATIONS

Temptronic Corporation, Model TP03000 Series Thermo-Chuck® Systems (undated brochure).
Temptronic Corporation, Model TP03200 Series Thermo-Chuck® Systems, Jun. 1997.
Micromanipulator Company, Inc., H1000 Series High Performance Thermal Chuck Systems, (8 pages) undated brochure.
Trio–Tech International, Artic TC Series Temperature Controlled Chucks, 11/96.

* cited by examiner

*Primary Examiner*—Michael Sherry
*Assistant Examiner*—Jimmy Nguyen
(74) *Attorney, Agent, or Firm*—Oppenheimer Wolff & Donnelly, LLP

(57) ABSTRACT

A temperature-controlled semiconductor wafer chuck system, the chuck being configured for mounting on a prober stage of a wafer probe test station, the chuck having a top surface and a bottom surface and including a heat sink configured for removing thermal energy from the chuck, a primary heater configured to add heat to the chuck adjacent the top surface of the chuck and a secondary heater adjacent the bottom of the chuck, whereby the temperature of the top surface of the chuck and the bottom surface of the chuck can be independently controlled; and wherein the chuck can include a plurality of layers above the heat sink which are connected so as to accommodate differential expansion and contraction and thereby minimize distortion of the chuck due to thermal effects; and wherein the heat sink and associated layers integrally connected are configured to stiffen the chuck and resist deformation due to forces applied to the chuck by probe pins.

35 Claims, 12 Drawing Sheets

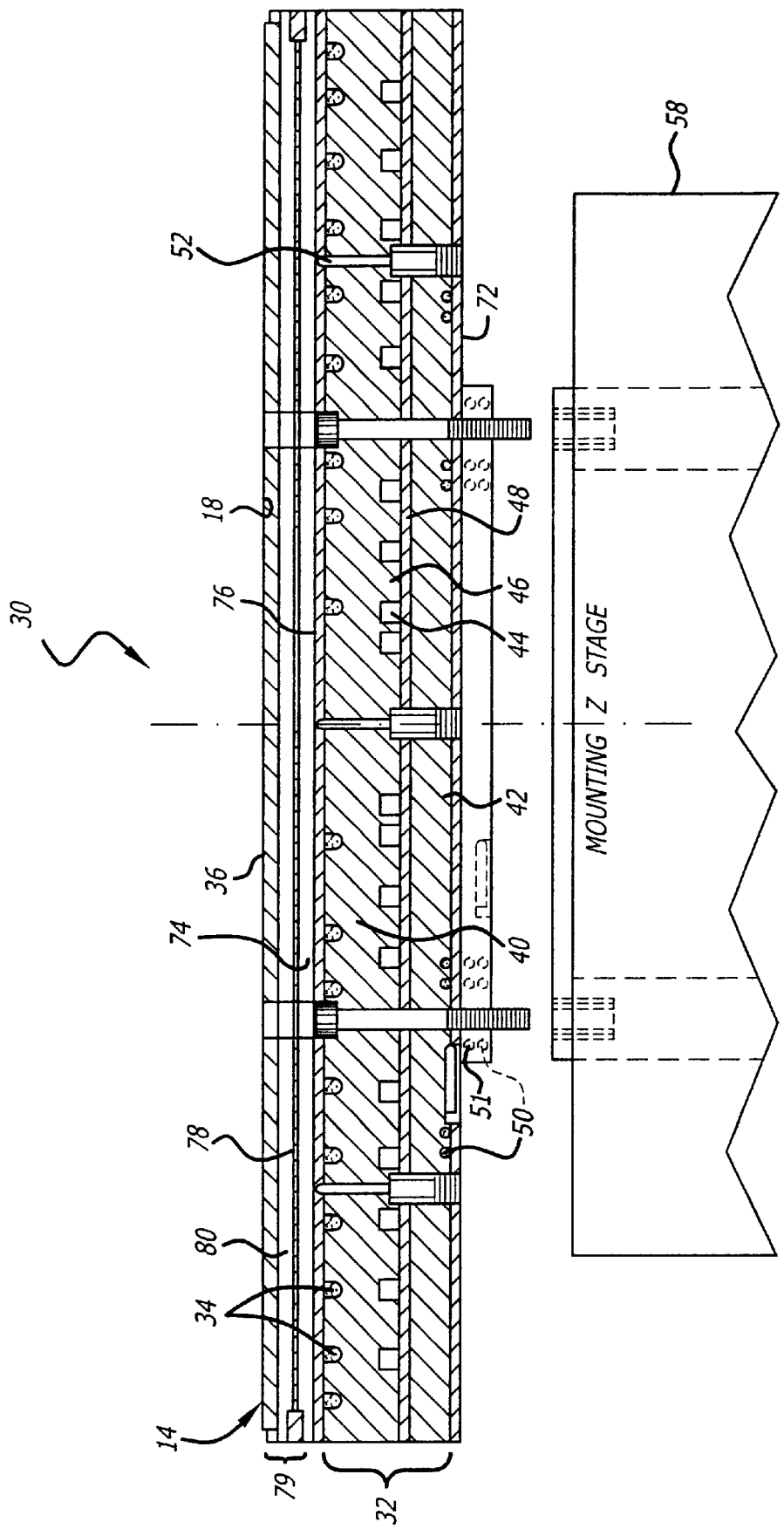

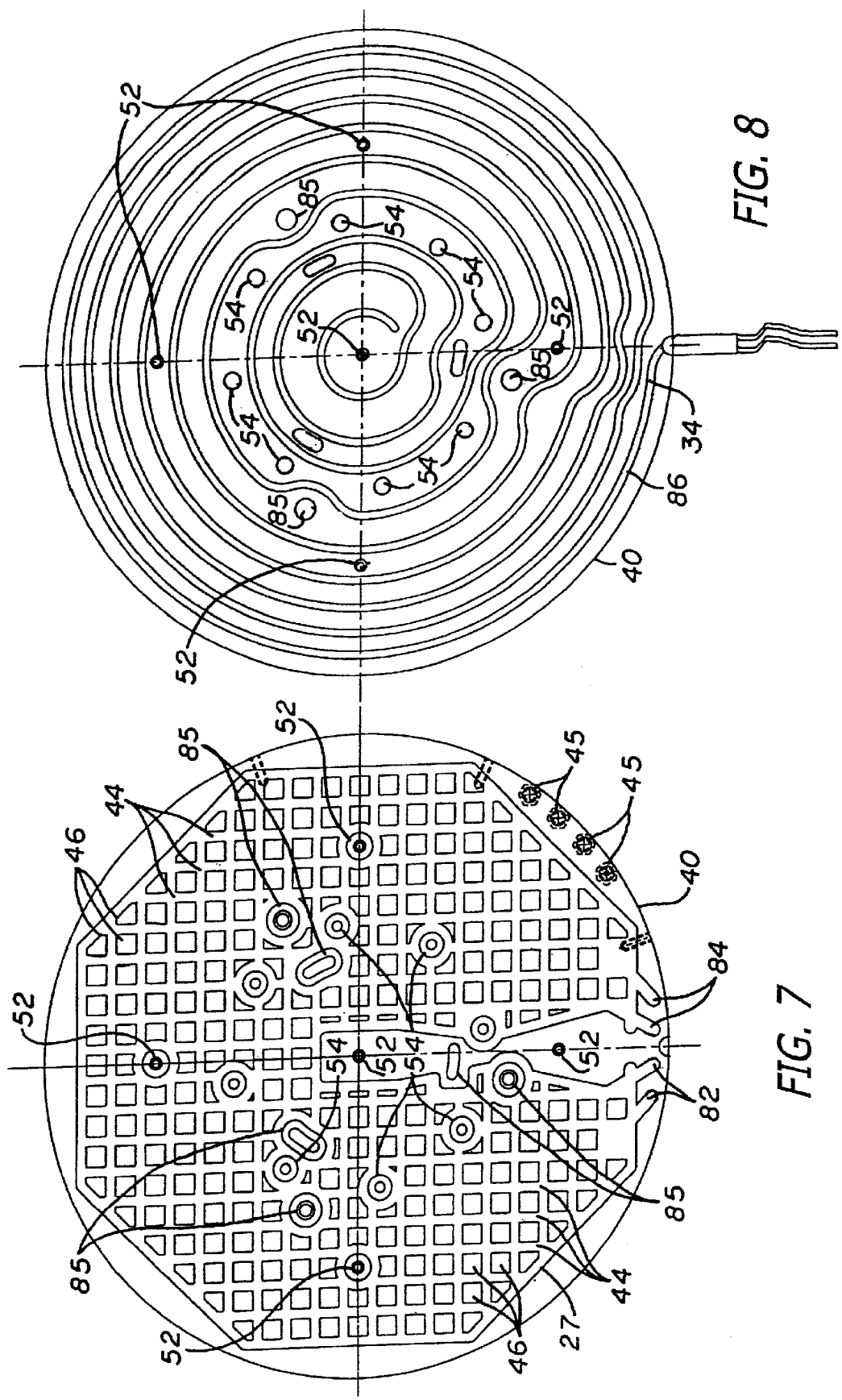

TEMPERATURE-CONTROLLED SEMICONDUCTOR WAFER CHUCK SYSTEM

BACKGROUND OF THE INVENTION

1. Field of the Invention

The invention relates generally to a semiconductor wafer platform, or chuck, used to support, and by means of applied vacuum, hold, a wafer for testing in a prober station. More specifically, the invention relates to a temperature-controlled semiconductor wafer chuck which directly heats or cools the semiconductor wafer for, and during, manufacture, testing, characterization, and failure analysis of semiconductor wafers and other components at hot and cold temperatures.

2. Description of the Related Art

In the conventional manufacture of semiconductor devices, semiconductor wafers are first produced. Each semiconductor wafer can contain many individual electronic devices or electronic circuits, which are known as dies. Each die is electrically tested by connecting it to suitable test equipment. Probe pins, which are connected to the test equipment, are brought into contact with the die to be tested. This generally occurs at a prober station, which conventionally includes a prober stage supporting a wafer chuck, which in turn supports the wafer. The prober station in production applications is usually an automated testing apparatus, and such stations are well known. Alternatively the prober station can be such as will facilitate manual testing by a human operator; and in the latter case also includes a means for magnifying the wafer for observation by testing personnel, which can be employed in confirming accurate probe placement. In either case a conventional prober station also includes means for micropositioning of the prober stage, and accordingly the chuck and a wafer supported thereon, with respect to test probes etc.

It is often required to control the temperature of the die during testing, and for this purpose the semiconductor wafer chuck can be a temperature-controlled chuck. In many cases such chucks are required to be able to both heat and cool the wafer. Many types of temperature-controlled chucks are known and are widely commercially available. The simplest form consists of a chuck incorporating a heater element; and the heater heats the chuck. This design relies on natural convection to cool the chuck. This method of cooling can be too slow for many commercial production test requirements.

Temperature-controlled chucks that incorporate heaters and heat sinks are also available. Heaters can take several forms, such as plate heaters, coil heaters, mica heaters, thin film heaters, peltier elements or heater rods incorporated into the chuck. Another method involves casting the heater rods into an element of the chuck structure. Cooling is provided by a heat sink that is cooled by a recirculating fluid, or in other designs by passing a fluid through the chuck without recirculating it. The fluid can be a liquid or a gas, usually air in the latter case. The liquid or air can be chilled for greater cooling effect in passing through the chuck, and can be recirculated for greater efficiency. A chuck cooled by means of a fluid chilled to a temperature below ambient temperature enables wafer probing at temperatures below ambient. In general, current conventional heat-sink designs incorporate simple cooling channels cross-drilled and capped in the chuck base.

In order to increase their performance, the density and complexity of semiconductor devices is increasing. Feature sizes, i.e. line widths, pad areas etc. are becoming increasingly smaller. This has led to certain new requirements for temperature-controlled chucks.

As an example, the number of probe pins to be connected to each individual die is increasing. Each of these probe pins can exert a pressure of up to several ounces on each of the test pads. With a high number of probe pins, which can be several hundred over a 1 square inch area or less, the supporting chuck is put under a relatively high load due to the applied force. This force can cause the chuck to deform. Bending and displacement of the chuck, even by relatively minute amounts, can, in turn, result in the test probe pins moving off the test pads.

A solid chuck, for example, not one that is temperature controlled, can provide the structural strength required for this probing. However, insufficient rigidity can be a problem for current temperature-controlled chuck designs. Conventionally, incorporating heating and cooling means reduces the structural strength of the chuck. Current temperature-controlled chuck design is limited to less than optimal performance in providing both the thermal performance and mechanical stability required for these high probe force applications. What is needed is a temperature-controlled chuck that has good thermal performance and also a high degree of structural strength in resisting loads induced by probe pins.

For accurate positioning of the probe pins on each die, the wafer chuck must remain mechanically stable. In addition to deformation resulting from applied load forces, heating and cooling of the temperature-controlled chuck can lead to changes in the height, leveling and planarity of the top surface of the chuck, which can in turn require re-calibration of the probe station, repositioning of probe pins, and re-focusing of microscopes. Current temperature-controlled chuck designs provide less than desirable mechanical stability over the needed temperature ranges. What is needed is a temperature-controlled chuck design that will minimize changes in height, leveling and planarity over the temperature range of the chuck during testing.

As mentioned, wafer chucks are usually mounted in probe stations that, amongst other functions, position the wafer chuck such that the semiconductor die is brought into contact with the probe pins. The chuck is mounted on a prober stage that can be moved, manually or automatically, with extreme accuracy. These prober stages in particular can be sensitive to changes in temperature. Current temperature-controlled chucks provide various means of thermal insulation between the chuck and the prober stage. Over time however, thermal energy can be conducted to or from the prober stage. In cases where the temperature deviates significantly from ambient this can cause inaccuracies of positioning or damage to the prober station or prober stage. What is needed is a system that mitigates or eliminates this and the other problems discussed above.

SUMMARY OF THE INVENTION

In a first aspect of the invention, a temperature-controlled semiconductor wafer chuck system is provided which incorporates a wafer chuck having a top surface and a bottom surface, the chuck being configured for mounting on a prober stage of a wafer probe station, the system comprising a heat sink incorporating a cooler, which further comprises a fluid conduit which distributes a coolant fluid substantially uniformly through the heat sink for removing thermal energy therefrom. The heat sink further comprises pillars disposed in the fluid conduit and configured to transfer force across the fluid conduit, whereby forces applied to the top surface of the chuck are transferred through the heat sink incorporated in the chuck to the prober stage, without substantial deformation of the chuck.

In another aspect of the invention it provides a temperature-controlled semiconductor wafer chuck system including a chuck further including a chuck top plate comprising a top surface of the chuck, a chuck bottom plate comprising a bottom surface of the chuck, a first heater disposed between the heat sink and the top surface of the chuck and a second heater disposed between the heat sink and the bottom surface of the chuck. With this configuration the temperature of the top surface of the chuck and the bottom surface of the chuck can be independently controlled. In a more detailed aspect the top and bottom surfaces can be independently maintained at different desired temperatures. This is done by independently controlling the first and second heaters as required to independently add heat to the chuck adjacent the top and bottom surfaces respectively, and removing heat through the heat sink as required by action of the cooler.

In another aspect of the invention, the heat sink further comprises a cooling conduit configured for guiding a heat absorbing fluid through the heat sink. The heat sink further comprises a multiplicity of pillars extending through the cooling conduit dividing it into a multiplicity of interconnected channels, the pillars being sized and placed to transmit force applied normal to the top surface of the chuck through the heat sink to the bottom surface of the of the chuck. In a more detailed aspect the heat sink can comprise at least two elements permanently joined to form an integral structure, at least one of the elements having the interconnected channels formed in one side and the other element closing the channels to form a fluid tight cooling conduit within a relatively rigid structure. Due to its configuration the heat sink substantially uniformly resists compressive loads due to forces applied in a direction perpendicular to the top surface of the chuck with minimum deformation, and also resists bending of the chuck when probe loads are applied nearer to the outer edges of the chuck in areas not directly supported underneath by a prober stage. The placement of the pillars can be such that it forms a uniform pattern.

In further more detailed aspects, the configuration of the cooling channel can be such that cooling fluid enters and exits the chuck at locations adjacent one another, the path of fluid flow being essentially U-shaped. The fluid channel can be formed by a machining or a casting process in fabrication of the heat sink. The majority of pillars can incorporate corners, tending to induce turbulent flow of the cooling fluid rather than laminar flow, improving efficiency.

Also in a more detailed aspect, the first or primary heater and the second or secondary heater can both be electrical resistance coil type heaters. They can employ a direct current power source.

In additional more detailed aspects, the temperature-controlled wafer chuck system can further comprise a first temperature sensor configured to monitor temperature at the top surface of the chuck, and a second temperature sensor configured to monitor the temperature adjacent the bottom surface of the chuck, the temperature sensors each generating a signal which is correlated with the temperature at the location of the sensor. Multiple sensors, forming an array, can be used to take into consideration local hot and cold spots on the top and bottom of the chuck in controlling temperature. The system can further comprise a controller configured to receive signals from the first and second temperature sensors or sensor arrays and control the first and second heaters and the cooler so as to control the temperature at the top and bottom surfaces of the chuck. A user interface can be employed, enabling selection of desired temperatures and communication of sensed temperatures at the top and bottom surfaces of the chuck. When the heaters are electrical, the controller can be programmed so that it raises or lowers the temperature at the top and bottom surfaces by increasing or decreasing the power supplied to a heaters gradually, rather than simply turning them on and off. This can be done so as to avoid electrical noise attendant sudden changes in current passing through the heater(s).

In a further more detailed aspect, the system can be configured so that the controller maintains the temperature of the bottom surface of the chuck at substantially the same temperature as the prober stage of a probing station during thermal test probing of a wafer, to minimize thermal effects on the prober stage during such testing.

In another more detailed aspect, the temperature-controlled wafer chuck of the system can further comprise an isolation layer disposed between the heater atop the heat sink and the top plate, said isolation layer being formed of an electrically non-conductive material. The temperature-controlled wafer chuck system can further include an electrically conductive guard layer disposed on top of the isolation layer, and a further isolation layer between the guard layer and the chuck top. With this configuration the guard layer and chuck top can be brought to the same electrical potential to further reduce current leakage through the chuck and further electrically isolate a wafer supported on top of the chuck during testing from electrical noise generated by heaters and prober mechanisms.

In another aspect of the invention the temperature-controlled wafer chuck can further comprise a differential expansion and contraction accommodation assembly, whereby distortion of the chuck due to differences in expansion and contraction between layer elements such as the top plate and the isolation layer and the heat sink and heater elements is minimized. The expansion and contraction accommodation assembly further can comprise over-sized and/or slotted holes in the elements and bolts and washers allowing relative movement between adjacent elements and minimizing distortion of the elements.

In the case of a chuck configured to also incorporate a conductive guard layer and further isolation layer, facilitating trivial or guarded testing of semiconductor wafer dies, increased potential for distortion exists and such a chuck can also further comprise a differential expansion and contraction accommodation assembly incorporated in a mechanical connection between the additional layer elements, whereby distortion of the chuck due to differential expansion and contraction of the layer elements is minimized.

Additionally, a chuck configured in accordance with principles of the invention can also be configured so that a vacuum can be created between the layer elements to further hold them in place in close proximity to each other while allowing relative movement due to differential thermal expansion.

As will be appreciated, a temperature-controlled chuck made in accordance with principles of the invention has good thermal performance, and also a high degree of structural strength in resisting loads induced by prober pins. The invention incorporates new design and assembly features that help minimize changes in height, flatness and planarity over the temperature range of the chuck. The chuck incorporates a method and apparatus for actively controlling the temperature of the base of the chuck to eliminate the problem of thermal effects on the prober stage, for example by matching the temperature of the bottom of the chuck to the temperature of the prober stage, which usually is the same as an ambient environmental temperature.

Other features and advantages will be apparent with reference to the appended drawings taken together with the following detailed description. These are given by way of example, and not by way of limitation of the scope of the invention.

BRIEF DESCRIPTION OF THE DRAWINGS

FIG. 6 is a cross sectional view of a wafer chuck in further illustrative embodiment;

FIG. 7 is a bottom view of a heat sink layer of the wafer chuck shown in FIGS. 3–6;

FIG. 8 is a top view of the heat sink layer shown in FIGS. 3–6, also showing a first, or primary, heater;

DETAILED DESCRIPTION OF THE PREFERRED EMBODIMENT(S)

Figure 1:
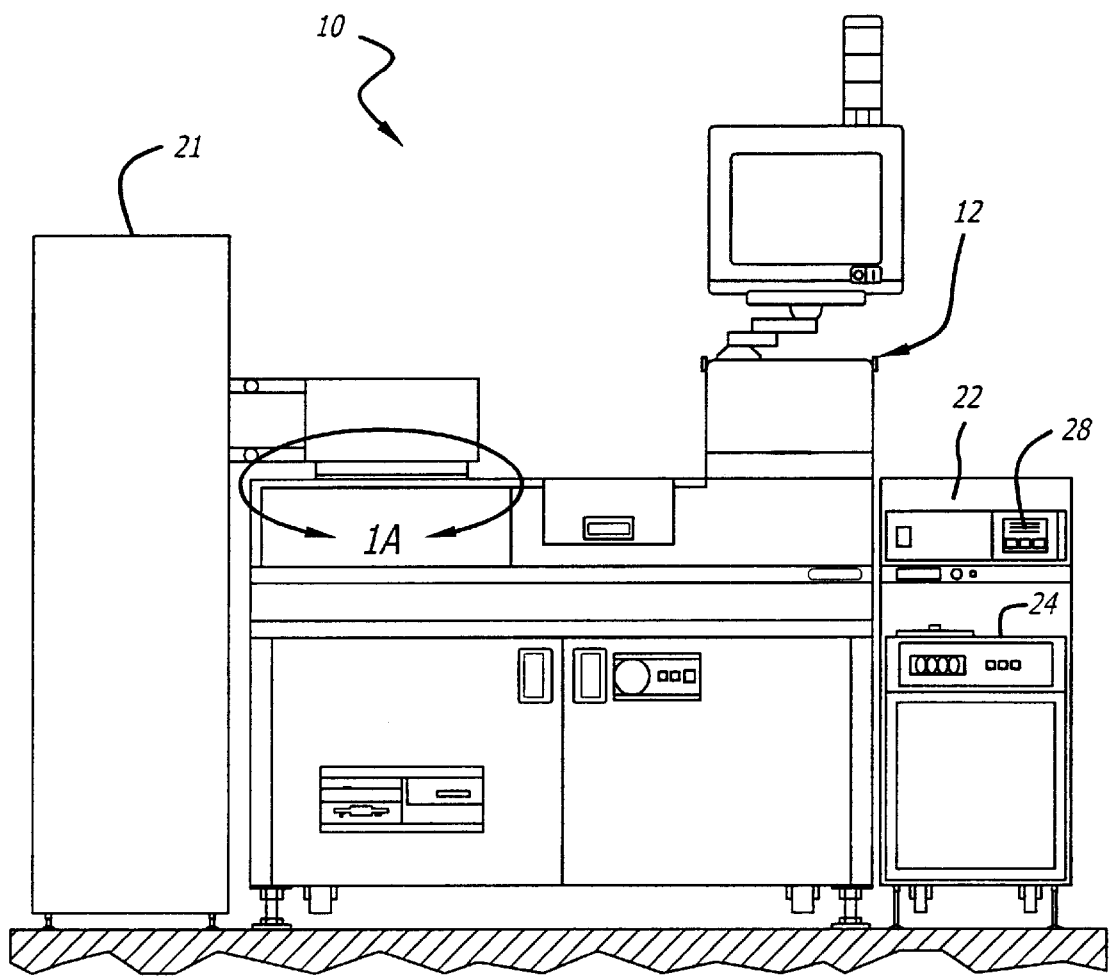
FIG. 1 is a front elevation view of a temperature-controlled semiconductor wafer chuck system in accordance with principles of the invention incorporated in a test station for testing of wafer dies, illustrating the environment of the invention.
Figure 1A:
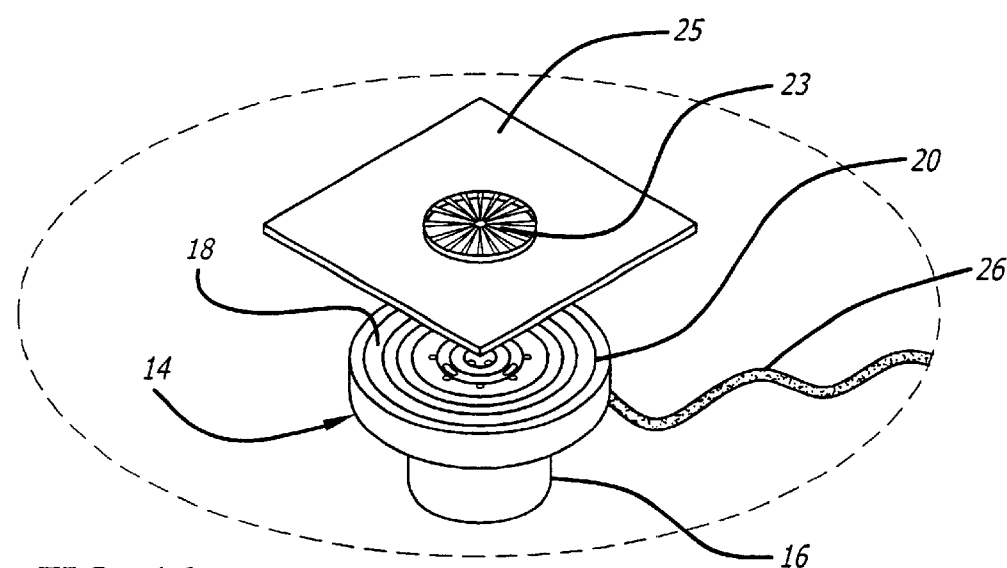
FIG. 1A is a perspective view of a portion of the semiconductor wafer test station shown in FIG. 1, further illustrating the temperature-controlled semiconductor wafer chuck system in accordance with principles of the invention, showing a temperature controlled semiconductor wafer chuck mounted on a prober stage of the test station for testing of wafer dies, further illustrating the environment of the invention.

With reference to FIGS. 1 and 1A of the drawings, a temperature-controlled semiconductor wafer chuck system 10 is incorporated in an automatic wafer probe test station 12. A temperature-controlled semiconductor wafer chuck 14 is mounted on a prober stage 16 of the prober station. A top surface 18 of the chuck supports a semiconductor wafer (not shown) and incorporates conventional vacuum line openings and grooves 20 facilitating secure holding of the wafer in position on the top surface of the chuck. Vacuum lines connecting to a vacuum source are conventional and are not shown. A system controller and heater power source 22 is provided to control the temperature of the chuck 14. A chiller 24 cools and recirculates a coolant fluid through the chuck via umbilical 26, the chiller cooling being controlled by the system controller. A user interface is provided in the form of a touch-screen display 28 where, for example, a desired temperature for the top of the chuck can be input. Alternatively, the controller can accept instructions from the prober, or other external means, through standard communication interfaces.

Probe pins 23 are mounted on a probe card 25 and are connected to an electrical test system 21. By aligning the chuck 14 and wafer mounted thereon with the probe pins, and bringing it into contact, individual dies are connected to the electrical test system. Testing of each of the individual dies formed in a wafer under test is effected by sequential connection of dies and cooperative action of the electrical test system and the temperature-controlled semiconductor wafer chuck system with the prober station.

Figure 2:
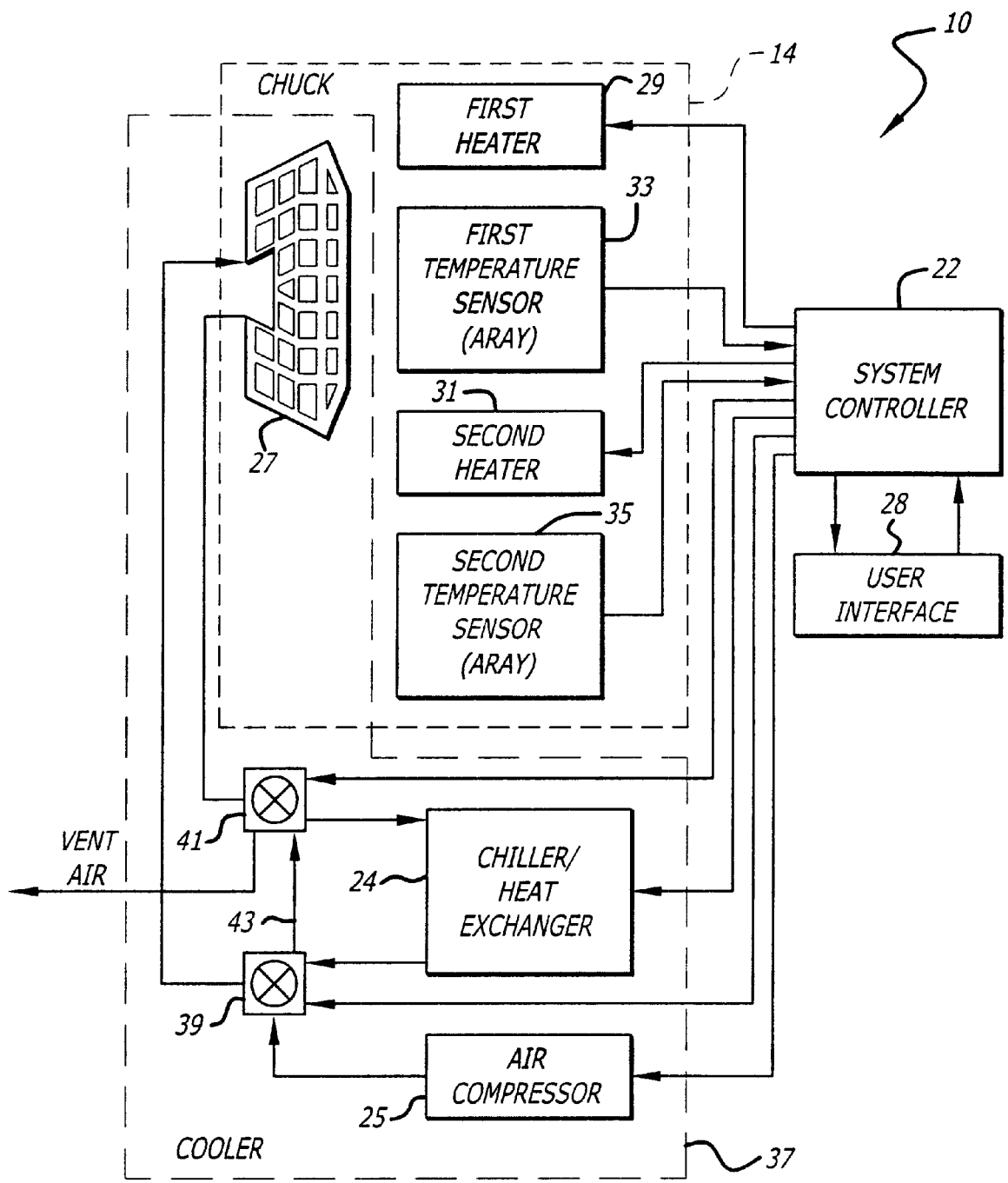
FIG. 2 is a schematic block diagram illustrating an exemplary temperature-controlled semiconductor wafer chuck system in accordance with principles of the invention.

With reference to FIG. 2, in a generalized schematic representation of the system 10 in accordance with principles of the invention, the chuck 14 includes a first or primary heater 29, a second or secondary heater 31, a first or primary temperature sensor 33, a secondary temperature sensor 35, and a cooler 37. The cooler includes a chiller 24 and/or an air compressor 25 outside the chuck and a coolant fluid conduit 27 within the chuck. Alternatively, in another embodiment a heat exchanger is used rather than a chiller, thermal energy being transferred to the atmosphere, and atmospheric temperature comprising a lower limit for cooling. However, faster cooling is possible if a chiller is used to cool the coolant fluid to a temperature below atmospheric. The cooler and the primary and secondary heaters are controlled by the system controller 22 in turn operated by an operator (not shown) through the user interface 28. As will be appreciated, the cooler can alternatively comprise another means of removing heat, for example a peltier device, or another refrigerative means, such as an evaporator, incorporated in the heat sink.

In one embodiment cooling of the chuck 14 is accomplished simply by blowing atmospheric air through the fluid conduit 27 by action of the compressor 25. In another embodiment a coolant fluid recirculates through the chiller 24 or a heat exchanger and the fluid conduit. In another embodiment a combination of capabilities for cooling is provided by both a chiller and an air compressor (air blowers are intended to be included in this term) and a controlled valving arrangement. A first valve apparatus 39 under control of the system controller 22 alternates the fluid source to the fluid conduit between the chiller and the air compressor. The first valve apparatus can itself comprise one or multiple valves conventionally actuated under electronic control. A second valve apparatus 41 under control of the system controller alternates fluid returning from the chuck between flowing to the chiller/heat exchanger 24 and venting to the atmosphere. If a liquid coolant is used additional provision can be made for purging the fluid conduit in the chuck and associated fluid lines in the umbilical 26 of liquid, as may be required, under automatic control before venting air directly to the atmosphere. Alternatively, the second valve apparatus can include an air trap and air vent valve (not shown), or equivalent structure, that allows air to be vented to the atmosphere but prevents liquid from escaping.

As will be appreciated in some production applications it may be desirable to reduce insofar as possible time spent cooling the chuck 14. As it can take some time to bring the chiller 24 and cooling fluid to a desired low temperature for cooling, the chiller can be run continuously and the cooling fluid recirculated so as to be continuously ready for cooling without need to start the cooler and bring the coolant fluid to the desired temperature. For this purpose in one embodiment a recirculating line 43 between the first valve apparatus 39 and second valve apparatus 41 is provided. Commensurately in this embodiment each valve apparatus is configured to selectively bypass or include the fluid conduit 27 of the chuck 14 in a fluid circuit traversed by the coolant fluid, and this can be in addition to functions described above.

Figure 3:
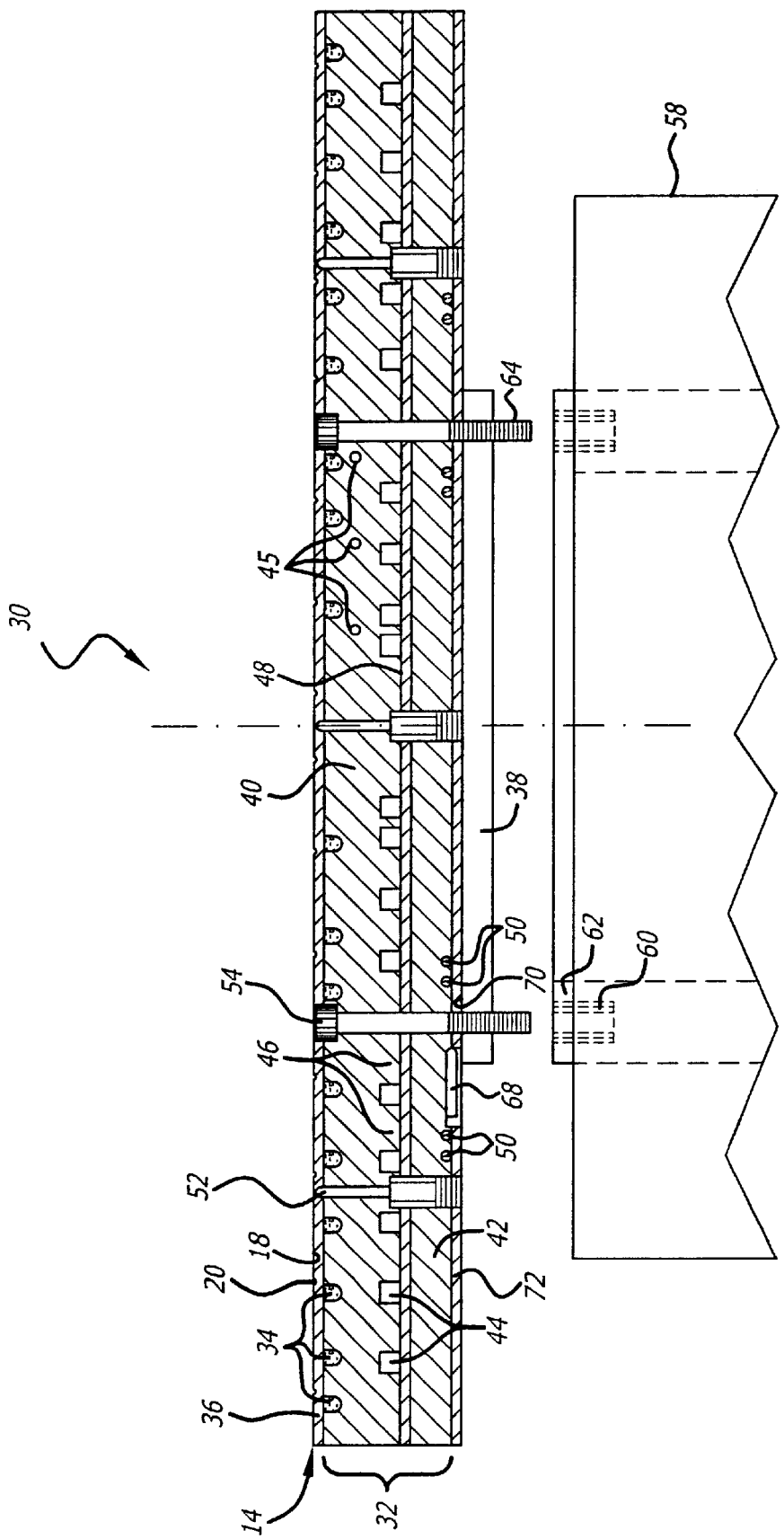
FIG. 3 is a cross sectional view of a temperature-controlled wafer chuck showing the main elements in one exemplary embodiment illustrative of principles of the invention.

With reference to FIG. 3, a temperature-controlled chuck assembly 30 in one embodiment comprises a multi-layer heat sink 32, a first, or primary, heater coil 34, a chuck top plate 36 incorporating vacuum grooves 20. The chuck further comprises vacuum conduits 45, and includes a ceramic insulation layer 38 to thermally and electrically isolate the chuck. The heat sink comprises a heat sink core layer 40, a base layer 42, cooling channels 44, pillars 46, a cooling channel cover plate 48, a second, or secondary, heater 50, resistance thermal devices (RTD)(s) 52 and mounting holes 54.

In this illustrated embodiment a cooling fluid, liquid or air, recirculates through the cooling channels 44, to remove heat from the heat sink 32 to lower its temperature, or maintain the heat sink at a desired temperature when the primary heater 34 is activated for example. In another embodiment the cooling fluid is not recirculated, for example air can be forced through the cooling conduit 27 comprising the fluid channels and vented to the atmosphere as discussed above. In either case the atmosphere absorbs and dissipates thermal energy transported out of the heat sink by the air blown through the chuck or by means of air circulating through the hot (condenser) side of the chiller.

When heating of the chuck top surface 18 of a chuck top plate 36 is required, for example to raise the temperature of a semiconductor wafer (not shown) supported thereon, the primary heater 34, is activated. This heats the top of chuck 18 to the desired temperature, which is sensed by the RTDs. When cooling is required the primary heater 34 is switched off. The top of the chuck will cool down due to the action of the coolant in the cooling channels 44.

In this illustrated embodiment, the insulation layer 38 is formed of a non-conductive ceramic material which can sustain relatively high compressive force loads. The ceramic material is conventional for this application, and provides thermal insulation with respect to the prober stage 58 due to low thermal conductivity, and also electrical isolation of the chuck 14 from the prober stage due to low electrical conductivity. To further maintain electrical isolation of the chuck with respect to the prober an insulation material 62, such as a phenolic, is incorporated into the prober stage. Helicoils 60 are set into the phenolic and mounting bolts 64, are bolted through the mounting holes 54 into the helicoils.

In addition to heating the test wafer, a conventional temperature-controlled chuck can also conduct heat to the prober stage 58. This is undesirable for the reasons mentioned above. An additional function of a heat sink incorporated in a conventional chuck with a heat sink is to insulate the chuck base from the heating effect of the heater. The chuck base will be maintained at or close to the temperature of the heat sink. However, the temperature of the heat sink may be varied depending on the temperature required for the chuck. For example if the chuck is operating at or above +35° C. the heat sink may be cooled to +25° C. If the chuck is operating at −15° C. the heat sink may be cooled to −25° C. This variation in temperature from atmospheric temperature will affect the prober stage. The thermal insulator 38 does provide some insulation of the prober stage from this temperature differential. However, over production test times, which can be several days, the temperature of the prober stage can rise and fall significantly as the thermal deficit or excess of the heat sink with respect to the prober stage will be conducted to the prober stage.

In the chuck 14 of the exemplary embodiment shown in FIG. 3, the secondary heater 50 is fitted to the bottom of the heat sink, and when activated mitigates the demand for thermal energy from the prober stage due to the difference in temperature between the heat sink and prober stage. A second, or secondary, temperature sensor 68 or sensor array involving multiple temperature sensors (not shown) is provided to sense the temperature at a bottom surface 70 of the chuck. The secondary temperature sensor(s) employs RTD (s) in the illustrated embodiment. The secondary heater is controlled independently of the primary heater such that it works against the cooling effect of the heat sink and eliminates extreme variations in the temperature of the bottom of the chuck due to action of the primary heater, as well as the cooler, of the chuck. In this way the prober stage can be shielded from extreme temperature variations which may cause errors in positioning and/or damage to equipment due to thermal effects on the prober stage.

In one embodiment the system 10 maintains the chuck base within a desired temperature range, for example, 33° C. to 50° C. In another embodiment the secondary heater is controlled such that it works with the cooling of the heat sink to maintain the base of the chuck substantially at a desired temperature, for example the temperature of the atmosphere around the prober station. This mitigates and/or minimizes any thermal effect on the prober stage 58 from the extremes of changing temperatures of the chuck top 18 and heat sink 32.

Figure 4:
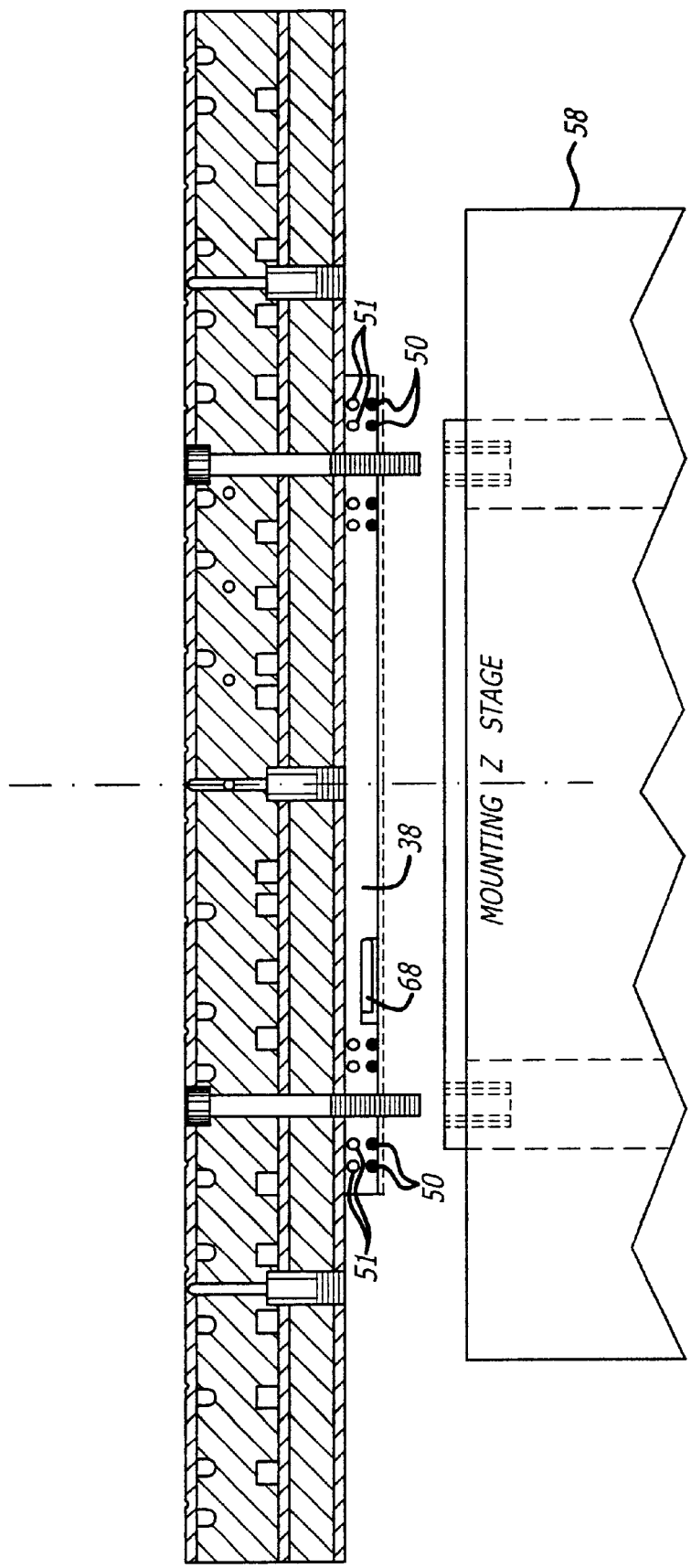
FIG. 4 is a cross sectional view of a temperature-controlled wafer chuck showing the main elements in another embodiment in accordance with principles of the invention.

Another embodiment of the design is shown in FIG. 4 where the secondary heater 50 is fitted into the thermal insulator 38. In addition, air or liquid cooling channels 51 can be included in the thermal insulator 38 to aid cooling of the insulator to provide further control of the temperature of the base of the chuck. The secondary temperature sensor 68, or multiple sensors comprising a sensor array, is also located in the thermal insulator in this embodiment, adjacent the bottom of the insulator. In this way the temperature of the prober stage is sensed directly. This is particularly useful in regulating the temperature of the bottom of the chuck to minimize distortion of the prober stage.

In one embodiment the secondary temperature sensor 68 can comprise an array of sensors including an ambient temperature sensor located elsewhere on the prober stage 58 away from the chuck 14. In this case the system 10 can be configured to include in the programming of the controller 22 an algorithm for matching, as close as possible, the temperature of the bottom of the chuck to the ambient temperature of the prober stage.

In another embodiment two secondary heaters 50 are provided, one at the bottom of the heat sink 32 as shown in FIG. 3, and one at the bottom of the insulation layer 38 as shown in FIG. 4. This configuration allows lower temperatures for the chuck top surface 18 to be attained without undue cooling of the prober stage 58.

With reference to FIGS. 2, 3 and 4, the temperature of the top surface 18 and bottom surface 70 of the chuck 14 are independently controlled by controlling the current to the primary and secondary heaters 34, 50, respectively, and the temperature of the coolant fluid circulated through the coolant channels 44. In one embodiment, the temperature sensor(s) 52, which will comprise a device such as thermocouple or RTD, is mounted close to the chuck top surface 18 of the top plate 36 which feeds back the temperature of the chuck top to the temperature controller 22. If the chuck top is below the desired temperature the temperature controller will supply more current to the primary heater 34 thus heating the chuck top. If the chuck top is above the desired temperature power to the heater will be reduced or switched off and the chuck top will cool by the action of cooling fluid flowing through the fluid conduit 27 of the heat sink 32. In the same manner the secondary heater 50 in the chuck base, whether positioned at the bottom of the insulation layer 38, or adjacent a chuck bottom surface 70 defined by a chuck bottom plate 72, and the secondary temperature sensor(s) 68 are used to maintain the temperature of the chuck base and/or the prober stage 58 within a desired temperature range or close to ambient temperature.

The temperature of the top and bottom of the chuck 14 are in essence independently controlled by means of the primary and secondary heaters 34, 50. However, as the means of cooling the chuck, i.e. the heat sink 32 and chiller 24, is common to both, optimally the temperature of the coolant fluid flowing in the fluid channels 44 is always adjusted to, and maintained at, a temperature where the differential between the temperature of the heat sink and the desired temperature of both the top and bottom surfaces of the chuck can be made up by the primary and secondary heaters, respectively. However, as mentioned, in one embodiment coolant channels 51 are also incorporated in the insulation layer, which allows the heat sink to be maintained at a higher temperature without raising the temperature of the prober stage in that embodiment, as additional heat energy entering the insulation layer is intercepted by the coolant and carried away before reaching the prober station.

The means of control can be conventional, and feed back from the temperature sensors 52, 68 is used to adjust the temperature of the coolant, and the primary and secondary heaters 34, 50 respectively. For example, in one embodiment of the invention the chuck top 18 temperature is controlled using multiple RTDs 52 and averaging the sensed temperature at each location, with or without discarding the highest and/or lowest reading. In another embodiment one RTD can be used, and will control the chuck top temperature based on the feedback from that one point. As an example of this in one embodiment the array of sensors can be used somewhat unconventionally to locally control temperature on the top surface 18 of the chuck 14. In certain applications, the temperature of the chuck top can be changed locally due to the action of high power devices which themselves can heat the chuck top. This can cause localized hot spots on the chuck top at the device under test. In these cases it may be desired to control the chuck temperature top temperature based on the local temperature of the device under test. That is to say, to control the localized temperature, or to avoid any effects from hot spots and maintain the chuck at a desired temperature at a particular location. One method to achieve these requirements is to use multiple temperature sensors, for example in one design 5 RTDs are employed to detect the location of a hot spot.

A sampling circuit and software routine in the controller 22 allows programming of different algorithms to control the chuck temperature. For example to avoid control influenced by any hot-spots and provide an average temperature control, the algorithm may sample all sensors 52, ignore the highest, average the other four and choose the closest to this average to control the chuck temperature. Alternatively the algorithm may choose to average all five and choose the closest to the average. But if control to a localized temperature is desired, for example the location of a die in high or low temperature testing, the controller can be configured to enable operator selection of the closest temperature sensor, or in another embodiment selection of the sensor registering the highest temperature (which is assumed to be reading a higher temperature because of a localized hot spot due to the device under test producing heat there) for controlling the temperature. As will be appreciated in the latter embodiments a truer temperature reading for the particular die under test can be obtained. If an absolute minimum temperature limit is desired the lowest reading sensor can be used to trigger the limit. The same is true of an upper limit.

With multiple primary (and also secondary) sensors 52, 68 a self test feature is possible in addition to test and calibration routines involving an independent temperature sensor. With no devices under test to produce localized hot spots, the sensed temperatures from each sensor over a range of temperatures are compared each other and/or to stored values for sensors at the various locations. In the case where the sensed temperatures are compared only to each other, if all are within a preset differential range limit of each other a "pass" condition is set. Otherwise an error message and/or alarm is used to alert an operator to an out-of-range condition indicating a problem with one or more sensors or the controller 22.

Use of stored values to modify this process can be made to take into consideration the fact that a slight and consistent variation between readings is possible when coolant is circulating through the conduit 27 due to the fact that coolant will change temperature as it absorbs heat in transiting the fluid channels 44 from an inlet to an outlet (not shown, see FIG. 7) and a consistent increase in coolant temperature will be expected along the general path followed by coolant fluid resulting in a consistent temperature differential between local temperatures. This is mitigated, however, by the configuration of the fluid conduit in the illustrated embodiment (again see FIG. 7) wherein the inlet and outlet are adjacent one another. Local differences in geometry of the heat sink can produce local variation also. These variations are very slight but are consistent and can be accounted for in this way. In practice such variations are usually within acceptable error limits for the test as a whole and need not be accounted for in the testing of conventional devices, but with this methodology increased accuracy in temperature conditions for testing is possible, and requirements for such accuracy can be met if need be.

The temperature controller 22 of the system varies the current to the heater(s) 34, 50 in order to maintain the desired temperatures at the top 18 and bottom 70 surfaces of the chuck 14. Conventional temperature controllers vary the current to the heater in several ways but in general the changes are rapid in nature. The fluctuations in the current level result in changes in the electromagnetic fields produced by the heating elements and associated wiring. These electromagnetic fluctuations are coupled to the chuck top and are manifested by electrical noise on the test wafer and in the measurement circuits (not shown). It is highly desirous to minimize this electrical noise for more accurate measurements.

To minimize this noise it is necessary to minimize or remove rapid changes in the electrical current to the heaters 34, 50. In one embodiment the current to the heaters is controlled in an "analog" or "linear" manner. The temperature controller 22 does not fluctuate the heater current directly. Instead the temperature controller is monitored by the system controller which in turn varies the output of the heater power supply in an analog or linear manner. This method avoids rapid changes or fluctuations of the heater current which helps minimize associated electrical noise on the chuck top and in the measurement circuits.

Figure 5:
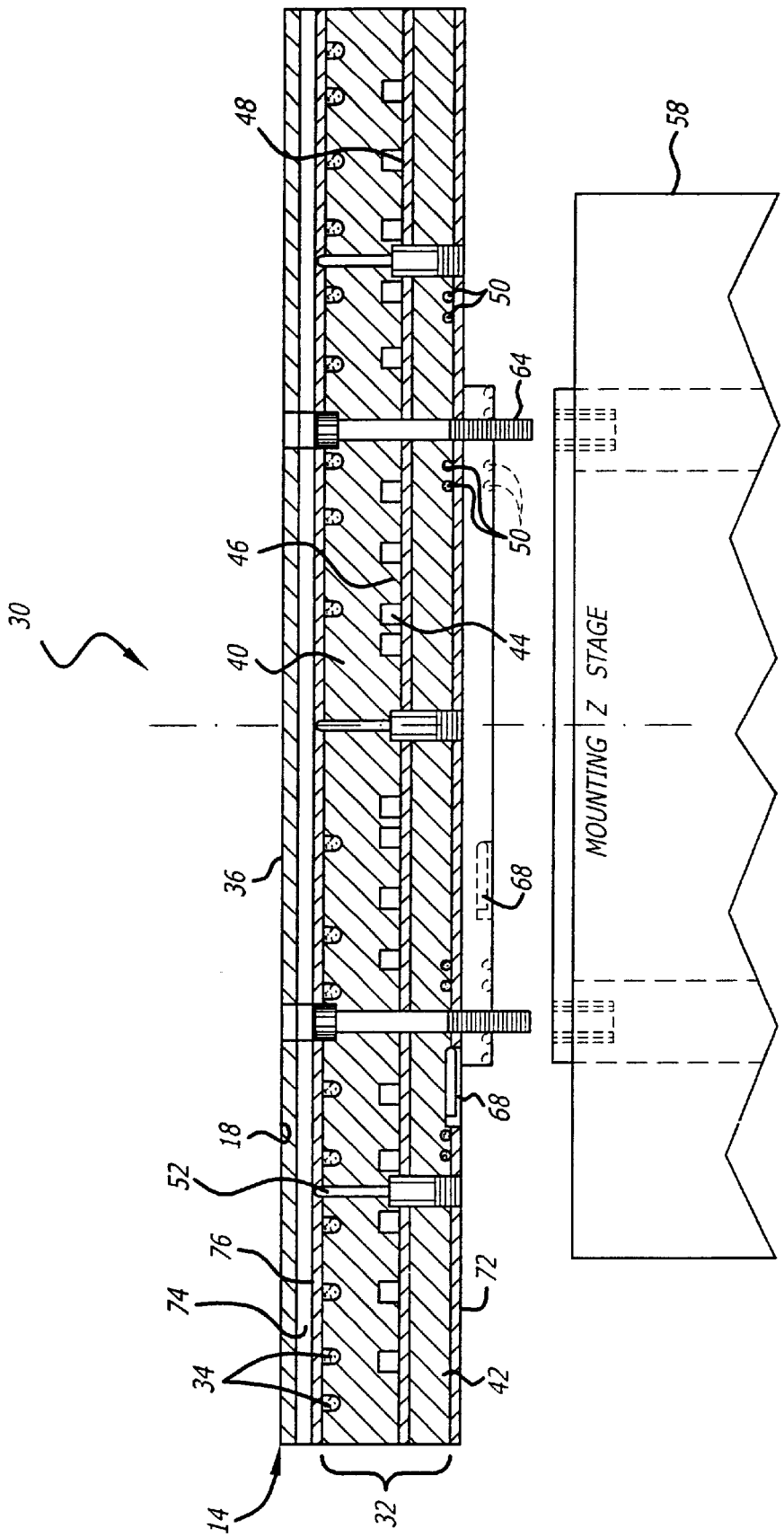
FIG. 5 is a cross sectional view of a wafer chuck in another illustrative embodiment.
Figure 9:
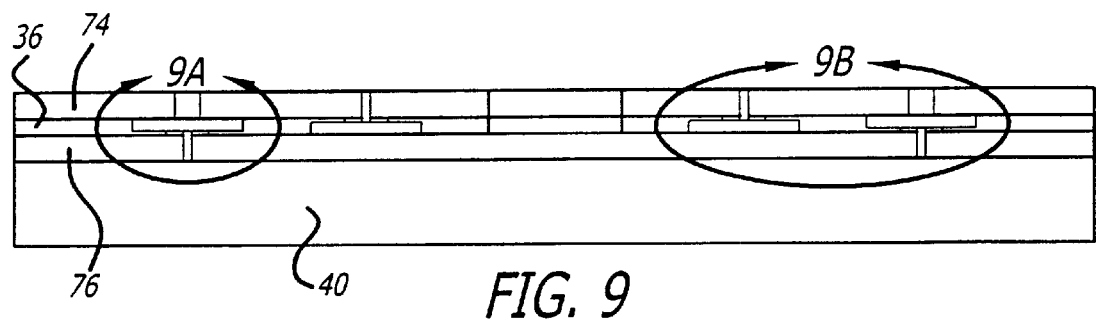
FIG. 9 is a cross sectional view of a portion of the wafer chuck shown in FIG. 5 showing further detail regarding interconnection of the layers.
Figure 9A:
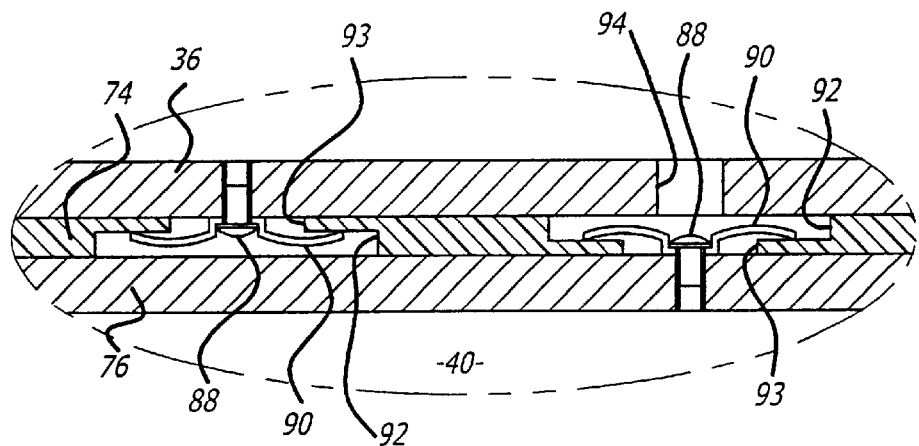
FIG. 9A is a cross sectional view of a portion of the wafer chuck shown in FIG. 9, showing further detail regarding interconnection of the layers.
Figure 9B:
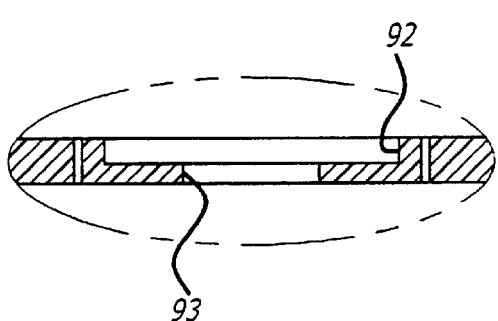
FIG. 9B is a cross sectional view of a portion of an isolation layer of the chuck illustrated in FIG. 9 showing further detail of the interconnection of the layers.
Figure 9C:
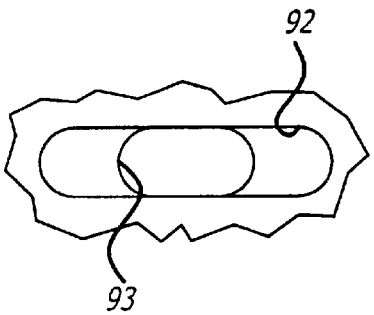
FIG. 9C is a top view in breakaway of a portion of the isolation layer shown in FIG. 9B showing an allowance for thermal expansion and contraction in the chuck assembly.
Figure 10:
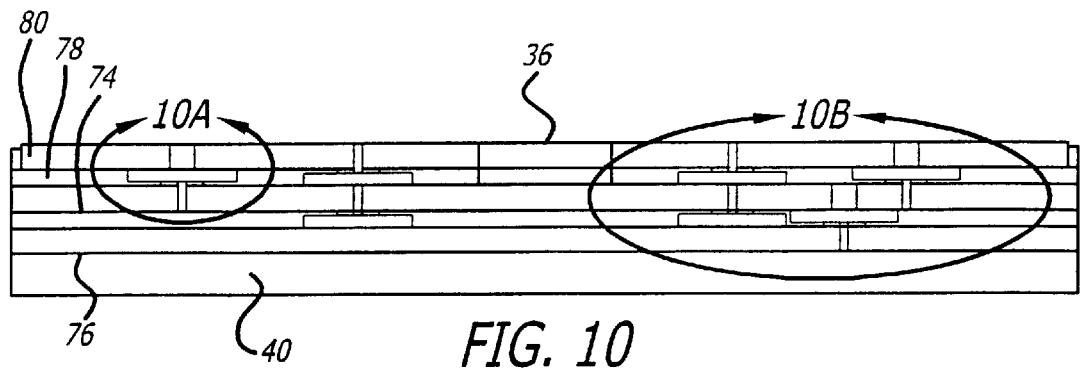
FIG. 10 is a cross sectional view of a portion of the wafer chuck shown in FIG. 6 showing further detail regarding interconnection of the layers.
Figure 10A:
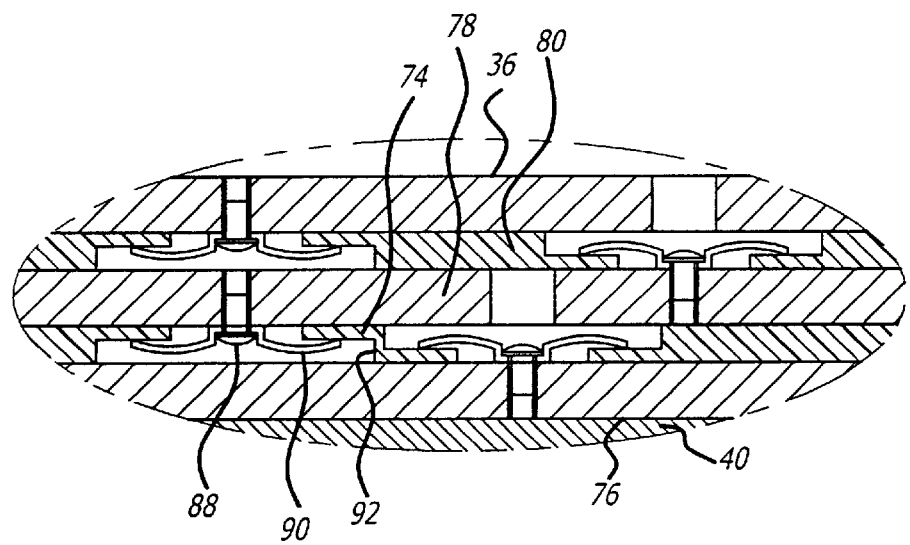
FIG. 10A is a cross sectional view of a portion of the wafer chuck shown in FIG. 10, showing further detail regarding interconnection of the layers.
Figure 10B:
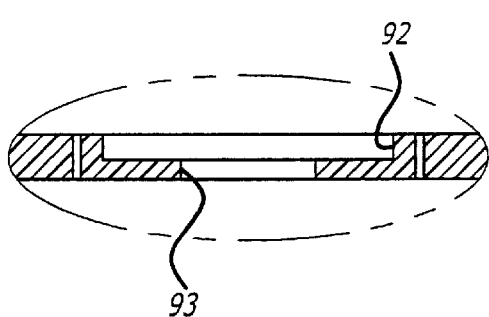
FIG. 10D is a cross sectional view of a portion of an isolation layer of the chuck illustrated in FIG. 10 showing further detail of the interconnection of the layers.
FIG. 10C is a top view in breakaway of a portion of the isolation layer shown in FIG. 10B showing an allowance for thermal expansion and contraction in the chuck assembly.
Figure 10C:
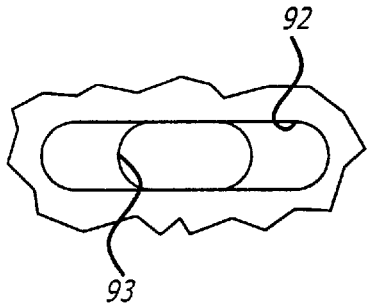

Another embodiment is shown in FIG. 5, wherein the chuck top surface 18 is electrically isolated from the primary and secondary heaters 34, 50 and heat sink 32 assembly. In this embodiment an additional isolation layer 74 and an additional primary heater cover plate 76 in addition to the chuck top plate 36 are added above the heat sink 32.

This arrangement can be used when making sensitive measurements on a test wafer (not shown). In certain test configurations it is required for the chuck top 18 to have good electrical isolation from the heater 34, heat sink 32 and prober stage 58. This is required to minimize leakage currents through the chuck 14, reduce electrical noise from the heaters and prober and also to allow the chuck top to be biased to a voltage if required. One method to achieve this is to add an isolation layer between the heater, heat sink and the chuck top itself, as shown.

The isolation layer 74 and chuck top plate 36 can be held in place by vacuum, ceramic bolts or other such means as to maintain electrical isolation from the chuck top to the heat sink 32. In this design the layers are held in place mechanically in a novel way as will be described below, and by vacuum conventionally such that electrical isolation is maintained. The configuration and assembly method to be described also allows movement both vertically and laterally such that the different layers 76, 74, 36 can expand and contract independently as the chuck heats and cools, avoiding warping and bowing.

For even more sensitive test measurements on a test wafer, the temperature-controlled chuck 14 can be configured to allow triaxial or guarded measurements. Such an embodiment of the invention is shown in FIG. 6. An additional conductive layer 78, conductive guard ring 79 and an additional isolation layer 80 are added. The guard ring 79 is attached to the conductive layer 78 so that they are electrically connected and together form an electrically conductive guard layer. The measurement method called triaxial or guarded measurement is required for low noise and high isolation wafer probing applications, and further minimizes the effects of leakage currents and electrical noise on the chuck top 18.

In a guarded measurement the heat sink 32 is connected as the shield. The additional conductive layer 78 and guard ring 79 act as the guard and are brought to the same potential as the chuck top plate 36. As the voltage difference, or potential, across the additional isolation layer 80 is low, the leakage current that can flow from the chuck top to the guard layer 78, and the shield 32, is also low. The additional isolation layer, conductive layer, conductive layer and guard ring together comprising an electrically conductive guard layer also shield the chuck top from electrical noise that may be coupled from the heaters 34, 50 in the chuck or from motors (not shown) in or associated with the prober stage 58.

As mentioned, the chuck 14 in accordance with principles of the invention provides advantages in applications where higher loads are applied to the chuck from numerous probes acting in a relatively small area. With reference to FIGS. 6 and 7, the structural strength of the chuck 14 is derived from the design and construction of the heat-sink assembly 32. The cooling conduit 27 including an inlet 82 and outlet 84, and numerous pillars 46 and cooling fluid channels 44 are incorporated in the heat sink core layer 40 constructed as shown, to achieve good cooling performance while at the same time maintaining high structural stiffness of the overall structure, particularly in resisting forces applied in a direction normal to the top surface 18 of the chuck. Either machining or casting the core material forms the cooling channels and the pillars. The cooling channels provide good circulation of the coolant while the pillars provide good surface area to conduct chuck heat to the coolant. The pillars, arranged as they are in a uniform pattern, also provide structural strength to the heat sink. For maximum strength the heat sink channels 44 are positioned in the middle of the layered heat sink assembly comprising the channel cover plate 48 and heat sink base 42 in addition to the core layer 40. The chuck bottom plate 72 and the chuck top cover plate 36 or primary heater cover plate 72 (depending on embodiment) are also integral with the heat sink as they are dip or vacuum brazed to the structure and accordingly further stiffen it.

The material used to form the heat sink 32 or its constituent layers can be various metals with good thermal conductivity and structural strength, such as aluminum or stainless steel. After the channels 44 and pillars 46 are formed, the cooling channel cover plate 48, is fitted and then dip-brazed or vacuum brazed such that all the edges of the core layer 40 and each pillar are brazed to the cooling channel cover plate.

With reference to FIGS. 6, 7 and 8, the first or primary heater 34 in this embodiment is a stainless steel direct current resistance coil heater. Alternatively the heater can be of other construction such that it provides good temperature uniformity to the chuck top. In this embodiment heater channels 86, are machined or cast into the heat sink core layer top.

The heater configuration is designed to give optimum temperature uniformity on the chuck top 18 and at the same time provide a chuck top surface resistant to probing forces. The heater is installed and the primary heater cover plate 76, is fitted. The assembly is vacuum brazed which connects the heater cover plate to the heat sink core layer and intimately connects the heater coil to the heat sink 32 and chuck top. Alternatively the heater can be cast into the heat-sink or achieve intimate contact by interference fit construction. The secondary heater 50, is installed in the same manner on the underside of the insulation layer 38 and/or the heat sink 32. The base layer 42 and the chuck bottom plate 72 comprising a secondary heater cover plate are dip or vacuum brazed to each other and the cooling channel cover plate 48 and heat sink core layer 40. Accordingly the heat sink 32 and a top and bottom cover plate 76, 72 respectively are intimately and integrally joined in a single unit, providing structural rigidity and good thermal energy transfer.

With reference to FIGS. 7 and 8, through holes 85 are included to facilitate loading pins (not shown) which pass through the chuck 14 for raising and lowering the semiconductor wafer onto the chuck. These holes are repeated in the other layers of the chuck construction.

As discussed above, it is generally required for the chuck top 18 to be electrically isolated from the heat sink 32 and prober stage 58. When additional isolation layers 74, 80 are added as in FIGS. 5 and 6, these can be held in place by vacuum, ceramic bolts or other such means as to maintain electrical isolation from the chuck top to the heat sink.

In one embodiment as shown in FIG. 5, the chuck top plate 36, isolation layer 74 and heat sink 32, 76 are assembled as shown in FIGS. 9, 9A, 9B and 9C. With reference to FIGS. 9, 9A, 9B and 9C, the isolation layer 74 is attached to the chuck top plate 36 by means of screws 88, and specialized clip washers 90 which are resilient and allow slip between layers and expansion of the isolation layer when tightened down by the screws. The screws and washers are installed in recesses 92 in the isolation layer. An identical though reversed arrangement is used to connect the isolation layer 74 to the primary heater cover plate 76 and heat sink core layer 40. The holes 93 in the isolation layers for the screws are oversize and slotted, which in combination with the screw and clip washer arrangement allow the layers to move against each other. As the chuck 14 heats and cools, the various components also heat and cool. Due to different thermal expansion coefficients of the chuck top plate 36 and isolation layer 74, these will expand and contract at different rates. If the layers are fixed together this can cause bowing or warping of a layer or the chuck itself as pointed out, and this arrangement mitigates this problem. As the chuck heats and cools the various layers can expand and contract laterally and vertically against each other thus minimizing the tendency to bow or warp.

After placement of washers 90 and screws 88 in recesses 92 of the isolation layer for connection of the isolation layer 74 to the cover plate 76 and heat sink core layer 40, assembly of the isolation layer to the chuck top 36 is carried out. The isolation layer and top plate combination is then assembled to the heat sink using the same method, accessing the screws through holes 94 in the top plate 36. Vacuum can be used to further hold the layers together. This configuration provides for secure mechanical attachment of the layers, maintains full electrical isolation between the chuck top and heat sink, and also provides for lateral and vertical movement of the layers as the chuck heats and cools.

Figure 14:
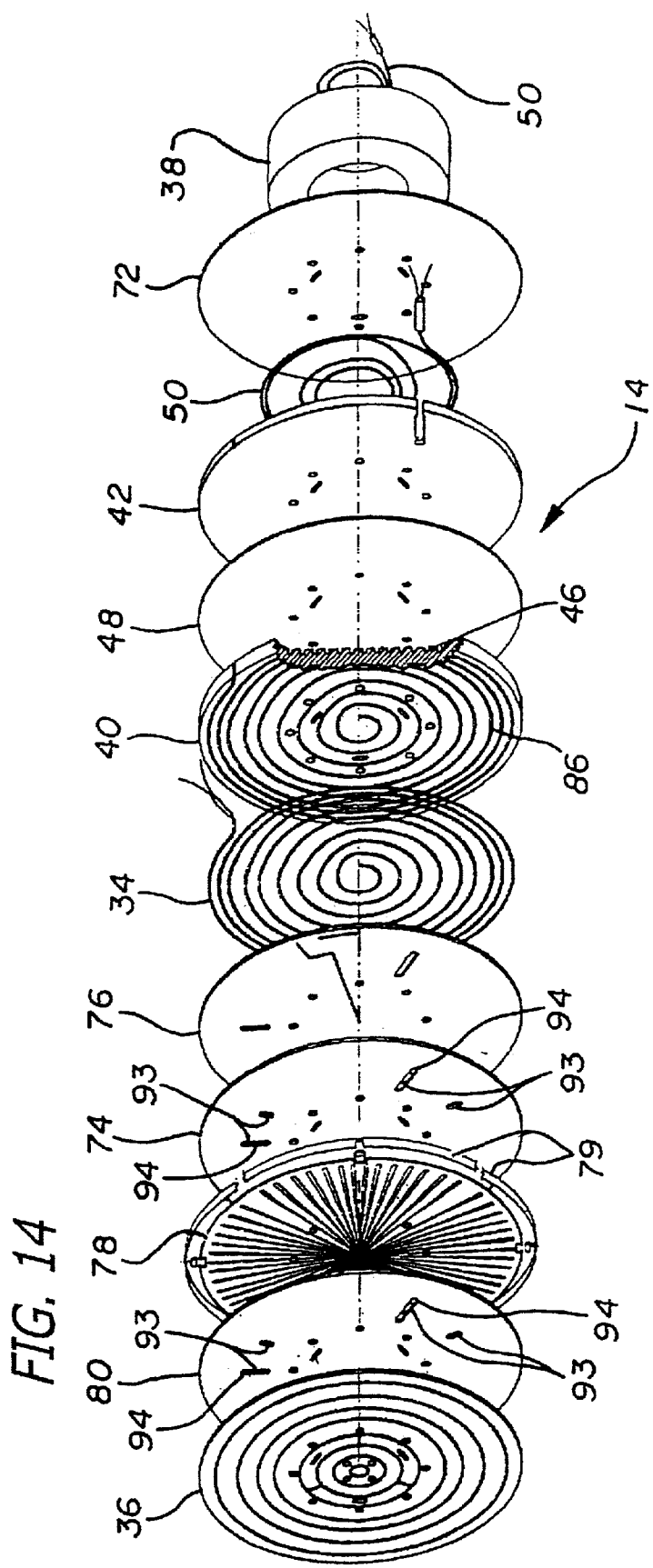
FIG. 14 is an exploded view of the wafer chuck shown in FIG. 6.

The embodiment shown in FIG. 6 including an additional conductive layer 78 and isolation layer 80, for triaxial or guarded measurements, is assembled in essentially the same manner, but including additional layers, as shown in FIGS. 10, 10A, 10B, 10C. An isometric view of the layers is shown in FIG. 14, and further illustrates the structure of the chuck 14 shown in FIG. 6. Analogous to the embodiment just discussed, the isolation layer 74 is bolted to the additional conductive layer 78 with the washers 90 and screws 88 pre-installed in the recesses 92 in the isolation layer. The assembly is then attached to the primary heater cover plate 76 and heat sink 40.

In a similar manner, the further isolation layer 80 is bolted to the top plate 36 with screws and washers pre-installed in the recesses in the further isolation layer. This assembly is then bolted to the additional conductive layer 78 by accessing the screws through the holes 94 in the chuck top 36.

Figure 11:
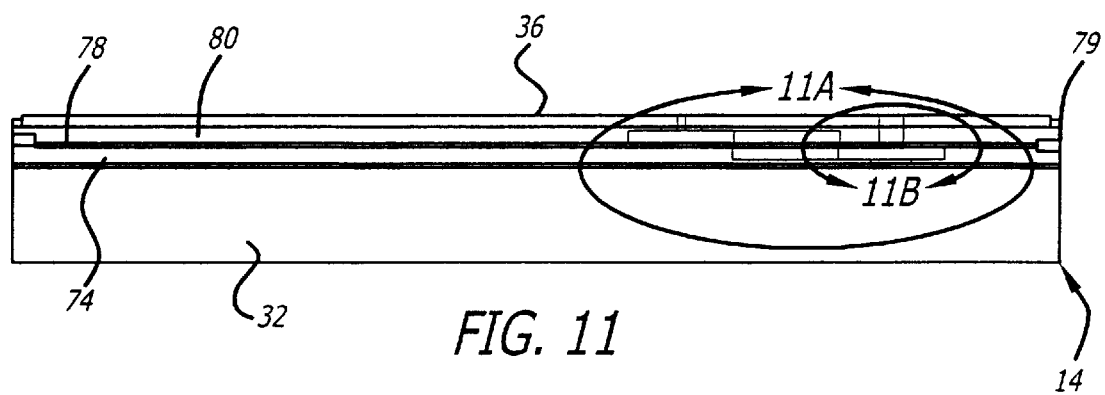
FIG. 11 is a cross sectional view of a portion of the wafer chuck shown in FIG. 6 showing further detail regarding interconnection of the layers in another embodiment.
Figure 11A:
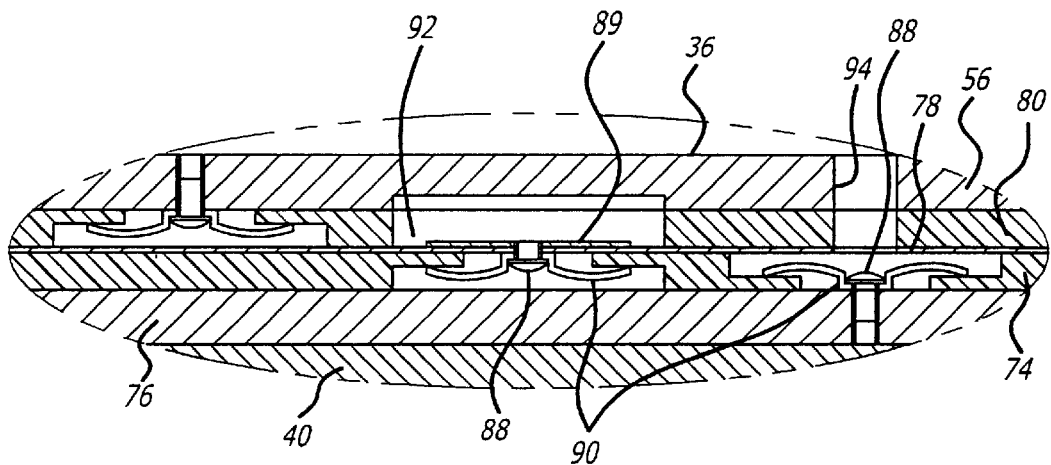
FIG. 11A is a cross sectional view of a portion of the wafer chuck shown in FIG. 11, showing further detail regarding interconnection of the layers.
Figure 11B:
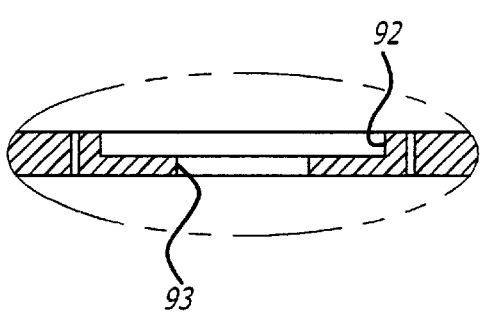
FIG. 11B is a cross sectional view of a portion of an isolation layer of the chuck illustrated in FIG. 11 showing further detail of the interconnection of the layers.
Figure 11C:
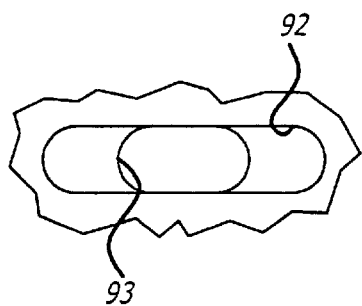
FIG. 11C is a top view in breakaway of a portion of the isolation layer shown in FIG. 11B showing an allowance for thermal expansion and contraction in the chuck assembly.

A further embodiment is shown in FIG. 11. The top plate 36 is bolted to the further isolation layer 80 with specialized wing nuts 89 pre-installed in recesses 92 in the further isolation layer 80. The isolation layer 74, additional conductive layer 78 and the further isolation layer 80 are assembled using washers 90 and screws 88, with washers 90 preinstalled in the recesses 92 in the isolation layer 74. The combination is then attached to the heat sink using the same method, accessing the screws through the holes 94 in the chuck top 36.

Figure 13:
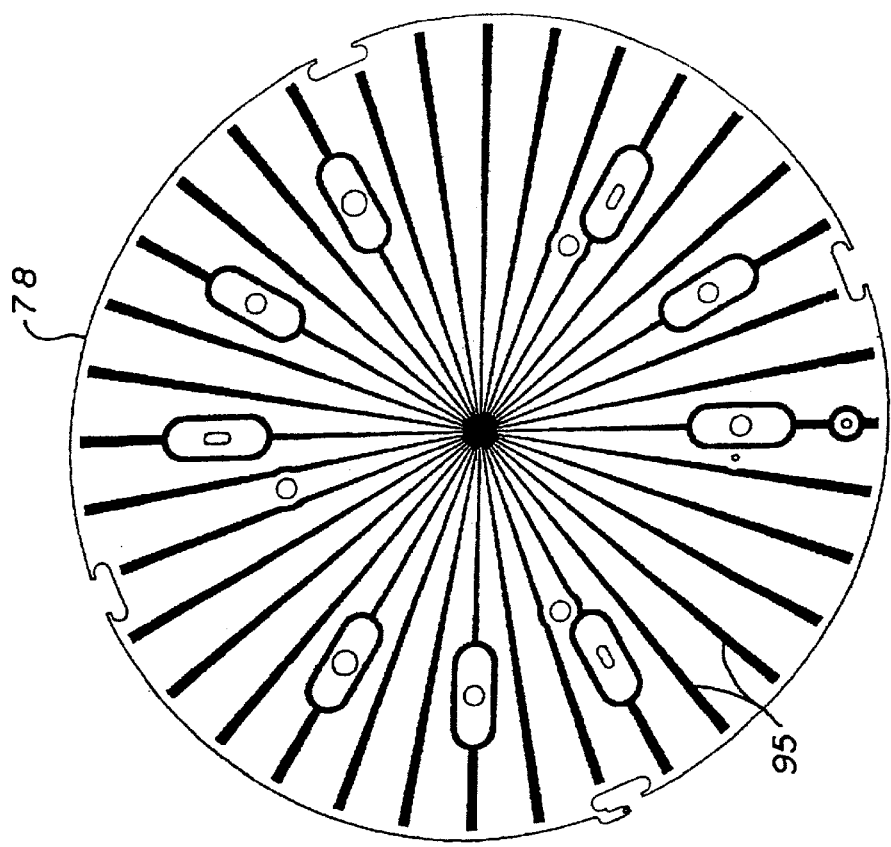
FIG. 13 is a bottom view of the further electrically conductive layer shown in FIG. 12.
Figure 12:
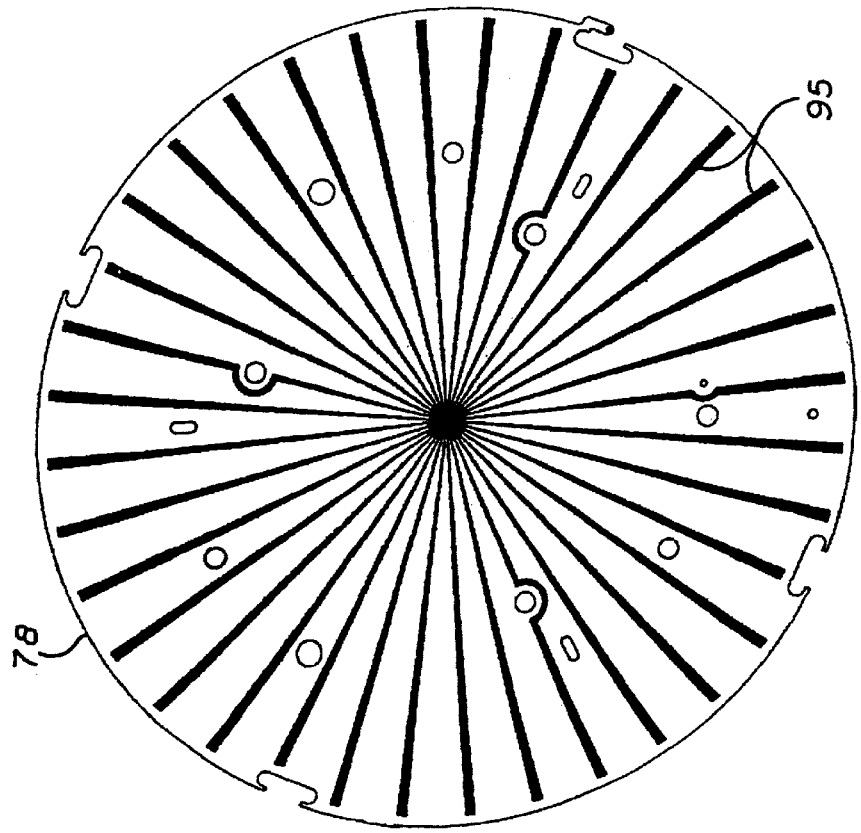
FIG. 12 is a top view of the further electrically conductive layer shown in FIGS. 6, 10 and 11 showing further detail.

Additionally, as mentioned, vacuum can be used to further hold the layers together by creating a vacuum between the layers. With reference to FIGS. 12 and 13, vacuum grooves 95 are formed in the top and bottom surfaces of the additional conductive layer 78. These are in fluid communication with a vacuum conduit (not shown) incorporated in the chuck 14. The grooves are configured such that the additional conductive layer 78, the further isolation layer 80, and the isolation layer 74 will be held together upon application of vacuum. In a similar manner vacuum grooves (not shown) on the rear of the chuck top 36 and on the primary heater cover plate 76 will further help to hold the assembly together when vacuum is applied.

With reference to FIG. 14 the construction of the temperature-controlled chuck 14 is further illustrated by separate depiction of the major component parts in order in exploded view. As will be appreciated the chuck shown includes the elements employed in the embodiment illustrated in FIG. 6. However, by deletion of appropriate elements the other embodiments can be visualized as the remaining elements in each case appear in order in the layered construction.

As will be apparent to those skilled in the art, the temperature-controlled semiconductor wafer chuck system 10 in accordance with principles of the invention provides advantages over conventional thermal chucks in mitigating distortion of the chuck 14 or prober stage 58 due to thermal effects and/or application of relatively high probing loads. Electrical isolation of a wafer under test can be improved by adding isolation layers and/or a guard layer without compromising dimensional stability due to differential expansion and contraction of the multiple layers of differing materials.

While the invention has been illustrated and described in relation to presently preferred embodiments, it will be understood that various modifications can be made within the spirit and scope of the invention. It is to be understood that the invention is not to be limited to the disclosed embodiments, and the scope is to include all variations and modifications within the scope of the invention as set forth in the appended claims.

We claim:

1. A temperature-controlled semiconductor wafer chuck system, the chuck having a first side configured to support a semiconductor wafer and a second side configured for mounting on a prober stage, comprising:
    a heat sink, including a cooler, the heat sink being intermediate the first and second sides;
    a primary heater disposed adjacent the first side for heating the semiconductor wafer;
    a secondary heater disposed adjacent the second side for heating the prober stage;
    a first temperature sensor adjacent the first side for measuring the temperature near the semiconductor wafer;
    a second temperature sensor adjacent the second side measuring the temperature near the prober stage;
    a controller configured to receive signals from the first and second temperature sensors and independently control the primary and secondary heaters;
    and wherein the controller adjusts the secondary heater according to the signals received from the second temperature sensor to shield the prober stage from thermal effects during testing.

2. The temperature-controlled semiconductor wafer chuck system of claim 1, further comprising a chiller incorporated in the cooler configured to remove thermal energy from the heat sink.

3. The temperature-controlled semiconductor wafer chuck system of claim 1, wherein the heat sink further comprises a cooling conduit configured for guiding a coolant fluid through the heat sink.

4. The temperature-controlled semiconductor wafer chuck system of claim 3, wherein the heat sink further comprises a multiplicity of pillars extending through the cooling conduit dividing it into a multiplicity of interconnected channels, the pillars being sized and placed to transmit force applied to the first side of the chuck through the heat sink to the second side of the of the chuck and to the prober stage, whereby the temperature-controlled semiconductor wafer chuck resists deformation due to forces applied to a top surface of the chuck.

5. The temperature-controlled semiconductor wafer chuck system of claim 4, wherein placement of the pillars forms a substantially uniform pattern.

6. The temperature-controlled semiconductor wafer chuck system of claim 5, wherein the majority of pillars further comprise a corner adapted to break up laminar flow of coolant fluid, whereby turbulent flow around the pillars is facilitated.

7. The temperature-controlled semiconductor wafer chuck system of claim 1, wherein the primary and secondary heaters are electrical resistance heaters.

8. The temperature-controlled semiconductor wafer chuck system of claim 1, further comprising a user interface enabling selection of desired temperatures and communication of sensed temperatures adjacent the first and second sides of the chuck and wherein said first temperature sensor comprises an array of discrete temperature sensors whereby local variation in temperature of the first side of the chuck can be accounted for in control of the temperature of the first side of the chuck.

9. The temperature-controlled semiconductor wafer chuck system of claim 1, wherein the controller maintains the temperature of the second side of the chuck at substantially the same temperature as a prober stage of a probing station during probing of a wafer to minimize thermal effects on the prober stage during testing.

10. The temperature-controlled semiconductor wafer chuck system of claim 1, wherein the heaters are electrical and driven by direct current, and the controller raises or lowers the temperature at the first and second sides by increasing or decreasing the power supplied to the heaters gradually in a continuous manner so as to minimize electrical noise attendant sudden changes in current passing through the heater.

11. The temperature-controlled semiconductor wafer chuck system of claim 1, further comprising:
    a top plate comprising a top surface of the chuck;
    an isolation layer disposed between the top plate and the heater and heat sink, said isolation layer being formed of electrically non-conductive material.

12. The temperature-controlled semiconductor wafer chuck system of claim 11, further comprising a differential expansion and contraction accommodation joint connecting the heat sink to the isolation layer and the isolation layer to the top plate, whereby distortion of the chuck due to differences in expansion and contraction between the top plate and the isolation layer and the heat sink elements is minimized.

13. The temperature-controlled semiconductor wafer chuck system of claim 12, wherein the expansion and contraction accommodation further comprises over-sized holes in the elements and fasteners allowing relative movement between the fasteners and the elements, whereby movement between adjacent elements is accommodated without distortion of the elements.

14. The temperature-controlled semiconductor wafer chuck system of claim 11, further comprising an electrically conductive guard layer disposed on top of the isolation layer and a further isolation layer between the guard layer and the chuck top plate, whereby the guard layer and chuck top plate can be brought to the same electrical potential to further reduce current leakage through the chuck and further electrically isolate a wafer on top of the chuck from electrical noise.

15. The temperature-controlled semiconductor wafer chuck system of claim 14, further comprising a differential expansion and contraction accommodation incorporated in mechanical connections between the layers, whereby distortion of the chuck due to differential expansion and contraction of the layer elements is minimized.

16. The temperature-controlled semiconductor wafer chuck system of claim 15, wherein a vacuum is created between the layer elements to further hold them in close proximity to each other while allowing relative movement due to differential thermal expansion.

17. The temperature-controlled semiconductor wafer chuck system of claim 1, wherein the cooler is disposed between the first and second temperature sensors.

18. The temperature-controlled semiconductor wafer chuck system of claim 1, wherein the second temperature sensor is adjacent the second side of the chuck and extends between the secondary beater and the second side of the chuck.

19. A temperature-controlled semiconductor wafer chuck system for supporting wafers under test in a probing station, the wafer chuck having a top side and a bottom side, comprising:
    a heat sink incorporated in the chuck and configured to resist deformation from loads applied to the top side of the chuck, the heat sink further comprising a cooler including a fluid conduit in the heat sink whereby fluid passes through the heat sink to carry away heat, the fluid conduit comprising pillars, arranged in a substantially uniform checkerboard pattern, dividing the conduit into a multiplicity of interconnected channels, the pillars being configured to transfer forces from loads applied to the top side of the chuck through the heat sink towards the bottom side of the chuck and to resist deformation of the chuck due to the applied loads.

20. The temperature-controlled semiconductor wafer chuck system of claim 19, wherein the heat sink further comprises a heat sink layer comprising a coolant channel formed in a bottom surface of the heat sink layer and a coolant channel cover plate in contact with the bottom surface of the heat sink layer thereby closing the channel.

21. The temperature-controlled semiconductor wafer chuck system of claim 20, further comprising a groove in a top surface of the heat sink layer configured to receive a first heater, wherein the first heater comprises an electric heater coil.

22. The temperature-controlled semiconductor wafer chuck system of claim 21, further comprising a base plate below the cooling channel cover plate, the base plate incorporating groves configured to receive a second heater, wherein the second heater further comprises an electric heater coil.

23. The temperature-controlled semiconductor wafer chuck system of claim 20, wherein the coolant channel further comprises a multiplicity of intersecting channels separating a multiplicity of pillars formed in the heat sink layer adjacent the bottom side thereof.

24. The temperature-controlled semiconductor wafer chuck system of claim 19, further comprising:
a first heater adjacent the top side;
a second heater adjacent the bottom side;
a controller;
a first temperature sensor adjacent the top side of the chuck; and,
a second temperature sensor adjacent the bottom side of the chuck,
the controller independently controlling the temperature of the top and bottom sides of the chuck by varying the heat output of the first and second heaters respectively, and controlling the amount of heat removed by way of the cooler, whereby a first temperature is obtained at the top side of the chuck and a second temperature is obtained at the bottom side of the chuck, the two temperatures being independently selectable.

25. The temperature-controlled semiconductor wafer chuck system of claim 24, wherein said first temperature sensor adjacent the top side comprises an array of individual temperature sensors.

26. The temperature-controlled semiconductor wafer chuck system of claim 25, further comprising a controller, the controller being configured to control the temperature of the top surface of the chuck and to take into account localized variation in temperature on the top surface of the chuck in so controlling the chuck.

27. The temperature-controlled semiconductor wafer chuck system of claim 19, further comprising:
a first heater adjacent the top side of the chuck;
a second heater adjacent the bottom side of the chuck;
a controller controlling the first and second heaters and the cooler;
whereby the temperature of the top side and the bottom side of the chuck are individually controllable.

28. The temperature-controlled semiconductor wafer chuck system of claim 19, further comprising:
a top plate adjacent the top side of the chuck;
an isolation layer intermediate the top plate and the heat sink;
an differential expansion accommodation joint between the top plate and the isolation layer; and,
an differential expansion accommodation joint between the isolation layer and the heat sink;
whereby deformation of the top plate of the chuck due to differential expansion and contraction of the heat sink, isolation layer and top plate is minimized.

29. A temperature-controlled semiconductor wafer chuck system including a chuck for supporting wafers under test in a probing station having a top side and a bottom side, comprising:
a heat sink having a top side;
a top plate adjacent the top side of the chuck;
an isolation layer intermediate the top plate and the heat sink;
an differential expansion accommodation joint between the top plate and the isolation layer; and,
an differential expansion accommodation joint between the isolation layer and the heat sink;
whereby deformation of the top plate of the chuck due to differential expansion and contraction of the heat sink, isolation layer and top plate is minimized.

30. The temperature-controlled semiconductor wafer chuck system of claim 29, further comprising a vacuum conduit facilitating application of a vacuum between adjacent elements to draw them into closer proximity yet allow relative movement in differential thermal expansion and contraction.

31. The temperature-controlled semiconductor wafer chuck system of claim 29, further comprising:
a first heater adjacent the top side of the chuck;
a second heater adjacent the bottom side of the chuck;
a cooler further comprising a cooling fluid conduit incorporated in the heat sink;
a controller controlling the first and second heaters and the cooler;
whereby the temperature of the top side and the bottom side of the chuck are individually controllable.

32. The temperature-controlled semiconductor wafer chuck system of claim 29, further comprising:
an additional conductive layer disposed on top of the isolation layer;
a further isolation layer intermediate the top plate and the additional conductive layer;
an differential expansion accommodation joint between the top plate and the further isolation layer; and,
an differential expansion accommodation joint between the further isolation layer and the additional conductive layer;
whereby deformation of the top plate of the chuck due to differential expansion and contraction of the heat sink, isolation layer, additional conductive layer, further isolation layer, and top plate is minimized.

33. The temperature-controlled semiconductor wafer chuck system of claim 29, at least one differential expansion accommodation joint further comprising:
a wing nut engaging a chuck layer element through an oversize hole and a fastener engaging an adjacent chuck layer element, whereby relative movement between the fastener and the chuck layer element having an oversized hole is accommodated.

34. The temperature-controlled semiconductor wafer chuck system of claim 33, further comprising a vacuum conduit facilitating application of a vacuum between adjacent elements which holds them in close proximity and yet allows relative movement therebetween.

35. The temperature-controlled semiconductor wafer chuck system of claim 29, further comprising a heat sink layer having a top side and a bottom side incorporated in the heat sink;

a coolant channel cover plate attached to the bottom side of the heat sink layer;

a cooler further comprising a fluid path comprising a multiplicity of channels formed in the heat sink layer adjacent the bottom side thereof, the path being formed by the heat sink layer and the channel cover plate, whereby fluid passes through the heat sink to carry away heat, and a chiller for removing heat from the fluid, and conduits connecting the fluid channel in the heat sink with the chiller, whereby a closed fluid system is defined for circulation of fluid through the heat sink to remove heat from the heat sink;

a chuck bottom plate adjacent a bottom side of the chuck;

a base plate disposed between the bottom plate and the coolant channel cover plate;

an insulation layer adjacent the bottom side of the chuck, the insulation layer being positioned below the chuck bottom plate;

a first heater disposed between the heat sink and the top surface of the chuck;

a second heater disposed between the base plate a and the bottom surface of the chuck; whereby temperature of the top surface of the chuck and the bottom surface of the chuck can be independently controlled and maintained at desired temperatures by independently controlling the first and second heaters as required to add heat to the chuck adjacent the top and bottom surfaces respectively, and removing heat through the heat sink as required by controlling the cooler.

* * * * *